United States Patent [19]
Scott, III et al.

[11] Patent Number: 5,121,080
[45] Date of Patent: Jun. 9, 1992

[54] AMPLIFIER WITH CONTROLLED OUTPUT IMPEDANCE

[75] Inventors: Baker P. L. Scott, III, Austin; Eric J. Swanson, Buda, both of Tex.

[73] Assignee: Crystal Semiconductor Corporation, Austin, Tex.

[21] Appl. No.: 633,478

[22] Filed: Dec. 21, 1990

[51] Int. Cl.⁵ .............................................. H03F 1/34
[52] U.S. Cl. .................................. 330/260; 330/85; 330/293
[58] Field of Search .................. 330/85, 99, 100, 103, 330/260, 293

[56] References Cited

U.S. PATENT DOCUMENTS 4,349,788  9/1982  Sondermeyer ............. 330/100 X
4,593,252  6/1986  Korn ........................... 330/260

FOREIGN PATENT DOCUMENTS 50148  4/1977  Japan ........................ 330/100
43833  4/1981  Japan ........................ 330/103

OTHER PUBLICATIONS

"Amp Skirts Impedance-Matching Losses, Cuts Distortion From DC to 200 MHz," *Electronic Design*, Mar. 8, 1990, p. 29.

*Primary Examiner*—James B. Mullins
*Attorney, Agent, or Firm*—Leonard & Lott

[57] ABSTRACT

An amplifier with controlled output impedance has a first output connected to the inverting input of the amplifier, and a second output, which forms the output of the amplifier, connected through a feedback conductance to the inverting input of the amplifier. A input conductance is connected from the inverting input to ground, and the input signal is connected to the positive input of the amplifier. The first and second outputs are provided by first and second current output stages. The currents provided by the first and second output stages are proportional to each other by a predetermined ratio. By proper selection of this predetermined ratio and the feedback and input conductances the desired output impedance and overall gain of the amplifier into a given load can be achieved.

24 Claims, 2 Drawing Sheets

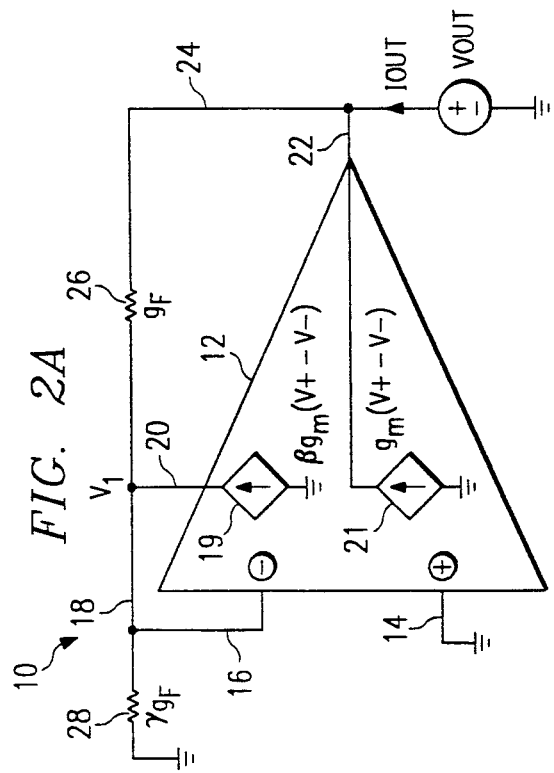
FIG. 1
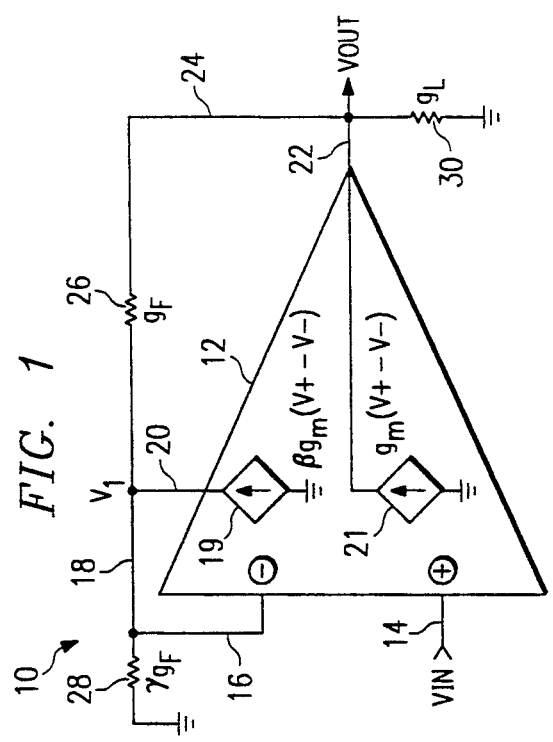
FIG. 2A
FIG. 2B
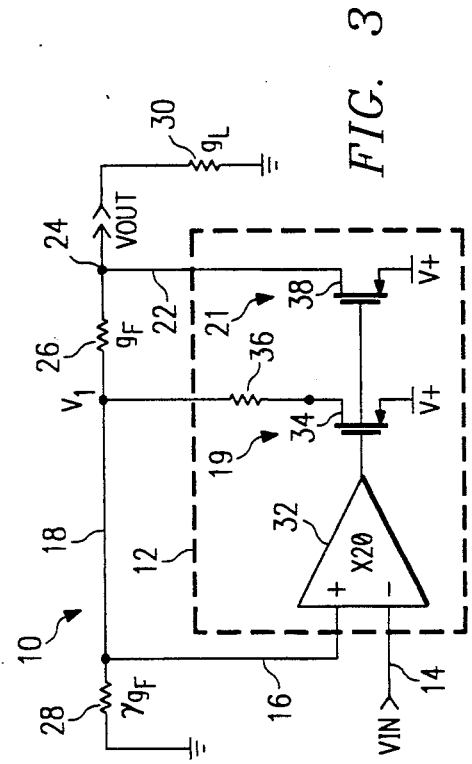
FIG. 3

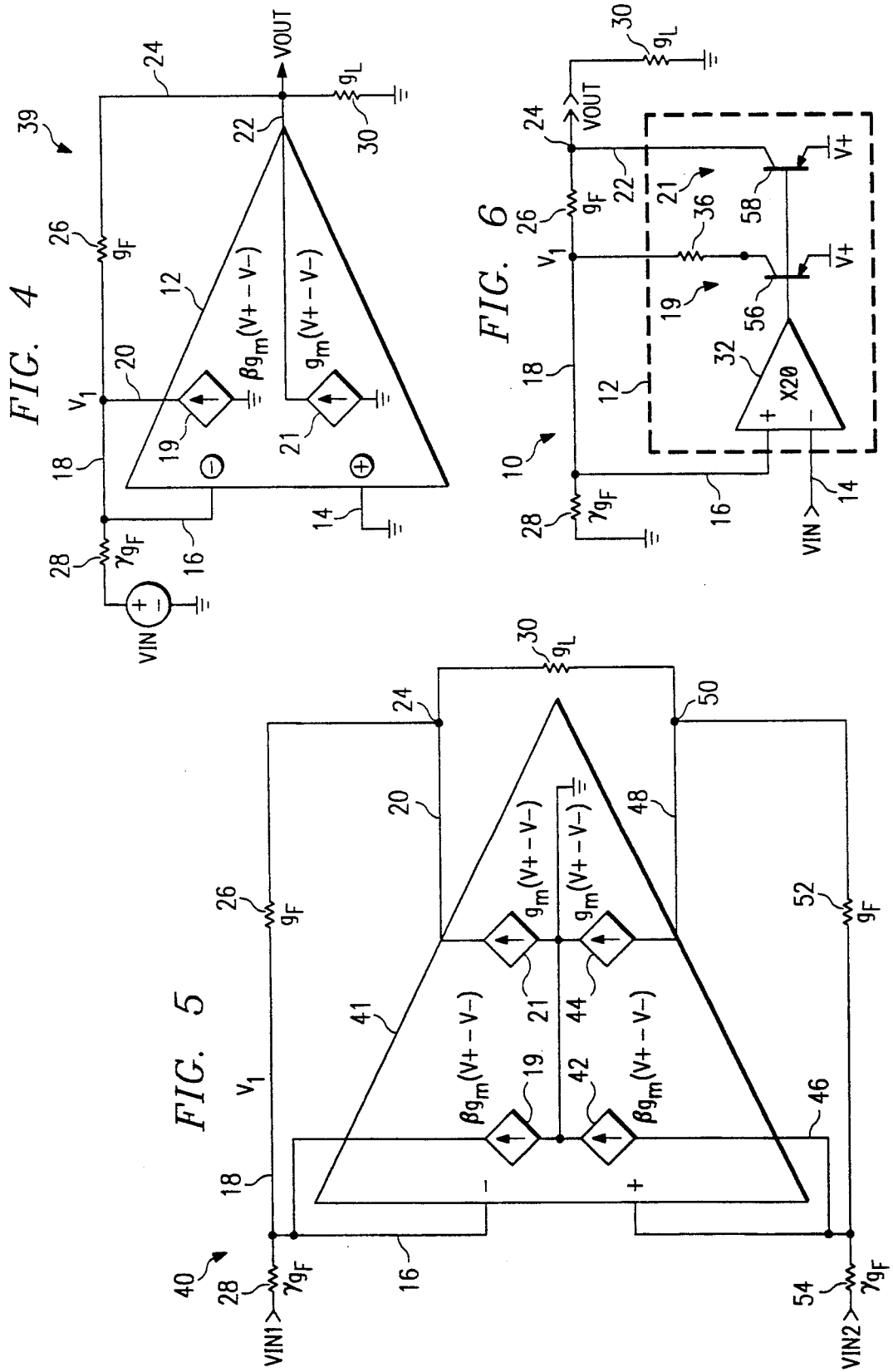

5,121,080

AMPLIFIER WITH CONTROLLED OUTPUT IMPEDANCE

TECHNICAL FIELD

The present application pertains to electronic amplifier circuits and, more particularly, to amplifiers with controlled output impedance.

BACKGROUND OF THE INVENTION

For most applications amplifiers are designed to have an output impedance which is either very low (voltage source) or very high (current source). However, in certain applications an intermediate output impedance is desirable. One such application arises in telecommunications applications when amplifiers are required to drive a coaxial cable transmission line.

Probably the simplest way to match a transmission line is to drive the line with a voltage source in series with a resistor. The voltage source has a source impedance which is much less than the series resistor and the impedance of the series resistor is the same as the characteristic impedance of the transmission line. The disadvantage of this approach is that the signal out of the voltage source must be twice as large as the signal into the transmission line. In most telecommunication applications the voltage into the transmission line is specified, and the doubling of this voltage is very difficult with low supply voltage IC technologies.

Therefore it can be appreciated that an amplifier with a controlled output impedance which matches the impedance of a transmission line and which does not require twice the output voltage is highly desirable.

SUMMARY OF THE INVENTION

It is, therefore, an object of this invention to provide an amplifier with a controlled output impedance without the amplitude loss inherent in a series resistor approach.

Shown in an illustrated embodiment of the invention is an amplifier which has a predetermined output impedance and which has first and second outputs. The first output is coupled to the inverting input of the amplifier. The second output provides the output from the amplifier which has the predetermined output impedance. A feedback conductance couples the second output to the inverting input of the amplifier.

In a further aspect the first and second outputs are generated by first and second current output stages respectively. The current from the first output stage is proportional to the current from the second output stage.

BRIEF DESCRIPTION OF THE DRAWINGS

The aforementioned and other features, characteristics, advantages, and the invention in general, will be better understood from the following, more detailed description taken in conjunction with the accompanying drawings, in which:

FIG. 1 is a block diagram of an amplifier according to the present invention;

FIGS. 2A and 2B are equivalent circuits of the amplifier shown in FIG. 1 for the purpose of determining the voltage gain and output impedance of the amplifier of FIG. 1;

FIG. 3 is a schematic diagram of a preferred embodiment of the amplifier of FIG. 1;

FIG. 4 is an inverting amplifier according to present invention;

FIG. 5 is a fully deferential amplifier according to the present invention; and

FIG. 6 is a bipolar version of the amplifier shown in FIG. 3.

It will be appreciated that for purposes of clarity and where deemed appropriate, reference numerals have been repeated in the figures to indicate corresponding features.

DETAILED DESCRIPTION

An amplifier with controlled output impedance according to the preferred embodiment of the present invention consists of a differential internal amplifier having two current outputs. The first current output is connected to the negative or inverse input of the amplifier. The second output forms the output of the amplifier and is also connected through a feedback conductance to the inverting input of the internal amplifier. The current out of the first output is proportional to the current out of the second output. In the noninverting embodiment of the amplifier an input signal is connected to the positive input of the internal amplifier. An input conductance is connected between the inverting input of the internal amplifier and ground. In an inverting embodiment of the amplifier the input conductance is connected from the negative input of the internal amplifier to the input signal and the positive or noninverting input of the internal amplifier is connected to ground. By proper selection of the current ratios and the feedback and input conductances, the desired output impedance and overall gain of the amplifier into a given load can be achieved.

Turning now to the drawings FIG. 1 is a block diagram of an amplifier having a controlled output impedance according to the present invention. As shown in FIG. 1 the amplifier 10 includes an internal amplifier 12 having a positive or noninverting input 14 connected to an input signal VIN. The internal amplifier 12 also has a negative or inverting input 16 connected to a node 18 also shown as $V_1$ in FIG. 1.

The internal amplifier 12 has two current output stages. A first output stage 19 having a current of $\beta g_m(V+ - V-)$, where $\beta$ is the ratio of the current from the first output stage to the current from the second output stage, $g_m$ is the gain of the internal amplifier 12, and $V+$ and $V-$ are the voltages appearing at the positive input 14 and negative input 16, respectively. The output of the first output stage 19 is placed on a line 20 which, in turn, is connected to node 18. The second output stage 21 has a current of $g_m(V+ - V-)$. The output of the second output stage 21 is placed on a line 22 which is connected to a node 24. Node 24 forms the output terminal of the amplifier 10. Coupled between the output terminal 24 and node 18 is a feedback conductance 26 also shown as $g_F$. An input conductance 28 is connected between node 18 and ground. The input conductance 28 is proportional to the feedback conductance 26 and the proportionality factor is $\gamma$. Thus the conductance of the input conductance 28 is $\gamma g_F$, where $g_F$ is the conductance of the feedback conductance 26. The input conductance 28 is shown as $\gamma g_F$ in FIG. 1. The amplifier 10 drives a load conductance 30 also labeled $g_L$.

The gain of the amplifier 10 shown in FIG. 1 is determined by first summing the current into node 18 to obtain $$\gamma g_F V_1 + g_F(V_1 - VOUT) - \beta g_m(VIN - V_1) = 0 \quad (1)$$

rearranging $$V_1(g_F + \gamma g_F + \beta g_m) + VOUT(-g_F) = \beta g_m VIN \quad (2)$$

Similarly the currents at the output terminal 24 are summed to obtain $$g_F(VOUT - V_1) + g_L VOUT - g_m(VIN - V_1) = 0 \quad (3)$$

rearranging $$V_1(-g_F + g_m) + VOUT(g_L + g_F) = g_m VIN \quad (4)$$

combining equations 2 and 4 provides $$VOUT = \frac{\begin{vmatrix} g_F + \gamma g_F + \beta g_m \beta g_m VIN \\ -g_F + g_m \quad g_m VIN \end{vmatrix}}{\begin{vmatrix} g_F + \gamma g_F + \beta g_M \quad -g_F \\ -g_F + g_m \quad g_L + g_F \end{vmatrix}} \quad (5)$$

solving for VOUT/VIN $$\frac{VOUT}{VIN} = \frac{g_m g_F + \gamma g_m g_F + \beta g_m^2 + \beta g_m g_F - \beta g_m^2}{g_L g_F + \gamma g_L g_F + \beta g_m g_L + g_F^2 + \gamma g_F^2 + \beta g_m g_F - g_F^2 + g_m g_F} \quad (6)$$

assuming that $g_L g_F$ and $\gamma g_F^2$ are much smaller than the other terms in the dominator in the above equation, then $$\frac{VOUT}{VIN} = A_V \approx \frac{g_F + \gamma g_F + \beta g_F}{\beta g_L + \beta g_F + g_F} = \frac{g_F(\gamma + \beta + 1)}{g_F + \beta g_F + \beta g_L} \quad (7)$$

Note that the gain ($A_V$) of the amplifier 10 is independent of the gain ($g_m$) of the internal amplifier 12 if the $g_m$ of the internal amplifier 12 is high.

The output impedance of the amplifier 10 is calculated using the equivalent circuit shown in FIG. 2A, which is the same as the circuit shown in FIG. 1 with the input signal VIN grounded. The equivalent circuit shown in FIG. 2A can be further simplified to the equivalent circuit shown in FIG. 2B for purposes of determining the output impedance for the amplifier 10. Summing the currents into node 18 and rearranging to solve for $V_1$ provides $$V_1 = VOUT \frac{g_F}{\gamma g_F + \beta g_m + g_F} \quad (8)$$

similarly summing the currents at the output node 24 and arranging to solve for IOUT provides $$IOUT = (\gamma g_F + \beta g_m) V_1 + g_m V_1 \quad (9)$$

$$= \frac{(\gamma g_F + \beta g_m + g_m) g_F VOUT}{\gamma g_F + \beta g_m + g_F} \quad (10)$$

since $$g_{OUT} = \frac{IOUT}{VOUT} \quad (11)$$

then, assuming that $g_m$ is much greater than $g_F$ $$g_{OUT} \approx g_F \frac{(\beta + 1)}{\beta} \quad (12)$$

For the example of an 83 ohm coaxial cable where $g_{out}$ equals 0.01202 mhos (which also equals $g_L$) the following parameters can be used:
$1/g_F = 1925$ ohms
$\beta = 0.045$
$\gamma = 3.127$
With these parameters the voltage gain is 2.0.

FIG. 3 is a schematic diagram of a preferred embodiment of the amplifier shown in FIG. 1. As shown in FIG. 3 the internal amplifier 12 consists of a differential gain block 32 in which the VIN signal is connected to the negative input of the gain block 32 and node 18 is connected to the positive input of the gain block 32. This reversal of polarities is required due to the inverting operation of the output stages. The first output stage consists of a p-channel MOS transistor 34 having its gate connected to the output of the gain block 32, its source connected to a positive supply voltage V+, and its drain connected to a series resistor 36 the other side of which is connected to node 18. The second output on line 22 is developed by an output stage consisting of another P channel MOS transistor 38 having its gate connected to the output of the gain block 32, its source connected to the positive supply voltage V+, and its drain connected to output terminal 24.

The $\beta$ factor of the two output stages is approximately determined by the relative W/L dimensions of the P channel transistors 34 and 38 as will be understood by those skilled in the art. The gain block 32 serves to provide a relatively large $g_m$ and also serves to level shift the differential input up toward the positive supply voltage.

The series resistor 36 is used to keep the drain-to-source voltage of transistor 34 approximately equal to the drain-to-source voltage of transistor 38 in order to preserve the $\beta$ current ratio of transistors 34 and 38.

FIG. 4 shows a schematic diagram of an inverting amplifier 39 according to the present invention. That is, the positive input on line 14 is grounded and the input conductance 28, instead of being connected between minus input terminal and ground, is connected between the minus input terminal and VIN in FIG. 4. The gain of the amplifier 39 is determined by summing the currents into node 18 to obtain $$\gamma g_F(V_1 - VIN) + g_F(V_1 - VOUT) - \beta g_m(-V_1) = 0 \quad (13)$$

Similarly the currents at the output terminal 24 are summed to obtain $$g_F(VOUT - V_1) + g_L VOUT - g_m(-V_1) = 0 \quad (14)$$

Applying the mathematics shown above $$A_V \approx \frac{-\gamma g_F}{g_F + \beta g_F + \beta g_L} \quad (15)$$

FIG. 5 is a schematic diagram of a fully differential amplifier 40 according to the present invention. As can be seen in FIG. 5 the internal amplifier 12 of FIG. 1 has been replaced by an internal amplifier 41 which has current output stages 42 and 44 in addition to the current output stages 19 and 21 of amplifier 12. The output from the current output stage 42 is connected to line 46 which, in turn, is connected to the positive input of the internal amplifier 41. The output from the current output stage 44 is connected to line 48 which, in turn, forms a second output 50 of the internal amplifier 41. The line 50 is also coupled to the positive input of the internal amplifier 41 through a second feedback conductance 52. The load conductance is connected between output terminals 24 and 50. A first input signal VIN1 is coupled to the negative input of the internal amplifier 41 through the input conductance 28. A second input signal VIN2 is coupled through input conductance 54 to the positive input of the internal amplifier 41.

It will be appreciated that the amplifier shown in FIG. 3 is able to only source current into the load 30. The embodiment shown in FIG. 5 provides matched output stages which use p-channel and n-channel transistors in each of the output stages 19, 21, 42, and 44 to both source and sink current through the load 30. Using the same type of analysis used to arrive at equation 12 above, the differential mode output conductance of the amplifier 40 is $$g_{OUT} \approx \frac{g_F}{2} \frac{(\beta + 1)}{\beta} \quad (16)$$

FIG. 6 is a schematic diagram of an alternative embodiment of the invention in which the MOS transistors 34 and 38 of FIG. 3 have been replaced by bipolar transistors 56 and 58, respectively. These transistors provide bipolar output stages for the internal amplifier 12.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. An amplifier comprising:
   a) an internal amplifier having a first output coupled to an inverting input of said internal amplifier;
   b) said internal amplifier having a second output for providing an output signal from said amplifier;
   c) a feedback conductance coupled between said second output and said inverting input, and
   d) wherein the output impedance of said amplifier is predominantly a function of the conductance of said feedback conductance and the ratio of the output currents at said first and second outputs.

2. The amplifier as set forth in claim 1 wherein said internal amplifier is a differential amplifier having said inverting input and a noninverting input.

3. The amplifier as set forth in claim 2 wherein an input signal is coupled to said inverting input.

4. The amplifier as set forth in claim 2 wherein an input signal is coupled to said noninverting input.

5. The amplifier set forth in claim 1 wherein said first and second outputs are driven by corresponding first and second current output stages wherein the currents from said first an second output stages are proportional to an input signal to the amplifier.

6. The amplifier set forth in claim 5 wherein said first and second output stages each comprises common source MOS transistors.

7. The amplifier set forth in claim 6 wherein said first and second output stages further include circuitry which maintains equal drain-to-source voltages across said common source MOS transistors in said first and second output stages.

8. The amplifier as set forth in claim 7 wherein said circuitry which maintains equal drain-to-source voltages across said common source MOS transistors in said first and second output stages comprises a resistor in series with the drain of said MOS transistor in said first output stage.

9. The amplifier set forth in claim 5 wherein said first and second output stages each comprise common emitter bipolar transistors.

10. The amplifier set forth in claim 1 wherein said first output and said second output provide currents which are proportional to each other by a predetermind amount.

11. The amplifier set forth in claim 10 wherein the output conductance is approximately equal to $$g_F \frac{(\beta + 1)}{\beta}$$

where $g_F$ is the conductance of said feedback conductance and $\beta$ is said predetermined proportion of the output current from said first output to the output current from said second output.

12. A noninverting amplifier having a predetermined output impedance comprising:
   a) an internal amplifier having a first output from a first current output stage coupled to an inverting input of said internal amplifier;
   b) said internal amplifier having a second output from a second output stage for providing an output signal from said amplifier;
   c) a feedback conductance coupled between said second output and said inverting input;
   d) an input conductance coupled between said inverting input and a reference potential;
   e) a noninverting input to said internal amplifier for receiving an input signal; and
   f) wherein the output impedance of said amplifier is predominantly a function of said feedback conductance and the ratio of said first current output to said second current output.

13. The noninverting amplifier set forth in claim 12 wherein the gain of said amplifier is approximately equal to $$\frac{g_F(\gamma + \beta + 1)}{g_F + \beta g_F + \beta g_L}$$

and the output conductance is approximately equal to $$g_F \frac{(\beta + 1)}{\beta}$$

where $g_F$ is the conductance of said feedback conductance, $\gamma$ is the ratio of said feedback conductance to said input conductance, $\beta$ is said ratio of said first current output to said second current output, and $g_L$ is the conductance of a load coupled to said second output.

14. The noninverting amplifier set forth in claim 12 wherein said first and second output stages each comprise common source MOS transistors.

15. The noninverting amplifier set forth in claim 14 wherein said first and second output stages further include circuitry which maintains equal drain-to-source voltages across said common source MOS transistors in said first and second output stages.

16. The noninverting amplifier set forth in claim 15 wherein said circuitry which maintains equal drain-to-source voltages across said common source MOS transistors in said first and second output stages comprises a resistor in series with the drain of said MOS transistor in said first output stage.

17. An inverting amplifier having a predetermined output impedance comprising:
   a) an internal amplifier having a first output from a first current output stage coupled to an inverting input of said internal amplifier;
   b) said internal amplifier having a second output from a second output stage for providing an output signal from said amplifier;
   c) a feedback conductance coupled between said second output and said inverting input;
   d) an input conductance coupled between said inverting input and an input signal;
   e) a noninverting input to said amplifier coupled to a reference potential; and
   f) wherein the output impedance of said amplifier is a function of said feedback conductance and the ratio of the output currents at said first and second outputs.

18. The inverting amplifier set forth in claim 17 wherein the gain of said amplifier is approximately equal to $$\frac{-\gamma g_F}{g_F + \beta g_F + \beta g_L}$$

and the output conductance is approximately equal to $$g_F \frac{(\beta + 1)}{\beta}$$

where $g_F$ is the conductance of said feedback conductance, $\gamma$ is the ratio of said feedback conductance to said input conductance, $\beta$ is said ratio of said first current output to said second current output, and $g_L$ is the conductance of a load coupled to said second output.

19. The inverting amplifier set forth in claim 17 wherein said first and second output stages each comprise common source MOS transistors.

20. The inverting amplifier set forth in claim 19 wherein said first and second output stages further include circuitry which maintains equal drain-to-source voltages across said common source MOS transistors in said first and second output stages.

21. The inverting amplifier set forth in claim 20 wherein said circuitry which maintains equal drain-to-source voltages across said common source MOS transistors in said first and second output stages comprises a resistor in series with the drain of said MOS transistor in said first output stage.

22. A noninverting amplifier having a predetermined output impedance comprising:
   a) a differential gain block having a positive input for receiving an input signal and a negative input;
   b) a first MOS transistor having its gate connected to the output of said gain block, its source connected to a first reference potential, and its drain coupled through a series resistor to said negative input;
   c) a second MOS transistor having its gate connected to the output of said gain block, its source connected to said first reference potential, and its drain providing an output signal from said amplifier having a predetermined output impedance;
   d) a feedback conductance coupled between the drain of said second MOS transistor and said negative input;
   e) a input conductance coupled between said negative input and a second reference potential;
   f) wherein the output impedance of said amplifier is a function of said feedback conductance and the ratio of current through said first MOS transistor to the current through said second MOS transistor.

23. The noninverting amplifier set forth in claim 22 wherein the gain of said amplifier is approximately equal to $$\frac{g_F(\gamma + \beta + 1)}{g_F + \beta g_F + \beta g_L}$$

and the output conductance is approximately equal to $$g_F \frac{(\beta + 1)}{\beta}$$

where $g_F$ is the conductance of said feedback conductance, $\gamma$ is the ratio of said feedback conductance to said input conductance, $\beta$ is said ratio of said first current output to said second current output, and $g_L$ is the conductance of a load coupled to said second output.

24. An amplifier comprising:
   a) an internal amplifier providing an output voltage proportional to an input signal;
   b) a first transconductance amplifier coupled to said internal amplifier and having a first output for providing a first output current proportional to said output voltage, said first output coupled to an inverting input of said internal amplifier;
   c) a second transconductance amplifier coupled to said internal amplifier and having a second output for providing a second output current proportional to said output voltage;
   d) a feedback conductance coupled between said second output and said inverting input; and
   e) wherein the output impedance of said amplifier is predominantly a function of said feedback conductance and the ratio of the transconductances of said first and second transconductance amplifiers.

* * * * *